(12) United States Patent
Jonsson

(10) Patent No.: US 7,736,734 B2
(45) Date of Patent: Jun. 15, 2010

(54) CUTTING TOOL INSERT

(75) Inventor: Anders Jonsson, Gävle (SE)

(73) Assignee: Sandvik Intellectual Property AB, Sandviken (SE)

( * ) Notice: Subject to any disclaimer, the term of this patent is extended or adjusted under 35 U.S.C. 154(b) by 686 days.

(21) Appl. No.: 11/641,941

(22) Filed: Dec. 20, 2006

(65) Prior Publication Data
US 2007/0160869 A1   Jul. 12, 2007

(30) Foreign Application Priority Data
Dec. 30, 2005   (SE)   .................... 0502958

(51) Int. Cl.
  *B23B 27/14*   (2006.01)
  *C23C 30/00*   (2006.01)
(52) U.S. Cl. ............... 428/336; 51/307; 51/309; 204/192.1; 407/119; 427/348; 427/368; 427/419.1; 427/419.2; 427/419.7; 428/697; 428/698; 428/699; 428/701; 428/702
(58) Field of Classification Search .......... 51/307, 51/309; 428/336, 697, 698, 699, 701, 702; 407/119; 204/192.1; 427/348, 368, 419.1, 427/419.2, 419.7
See application file for complete search history.

(56) References Cited

U.S. PATENT DOCUMENTS

| 4,643,620 | A | 2/1987 | Fujii et al. | |
| 5,858,480 | A | 1/1999 | Lio et al. | |
| 5,976,707 | A | 11/1999 | Grab | |
| 6,508,150 | B1 | 1/2003 | Bertschinger | |
| 6,682,274 | B2 * | 1/2004 | Votsch et al. | 407/119 |
| 7,188,463 | B2 * | 3/2007 | Schuller et al. | 57/408 |
| 7,396,371 | B2 * | 7/2008 | Cedergren et al. | 51/307 |
| 2006/0019120 | A1 | 1/2006 | Jonsson | |

FOREIGN PATENT DOCUMENTS

| DE | 10022274 | * | 1/2001 |
| EP | 1 473 385 | | 11/2004 |
| EP | 1 609 883 A2 | | 12/2005 |
| EP | 1 616 646 | | 1/2006 |
| GB | 2 406 814 | * | 4/2005 |
| JP | 04-013860 | * | 1/1992 |
| JP | 4-310325 | | 11/1992 |
| JP | 10-225804 | | 8/1998 |
| WO | 98/10119 | | 3/1998 |

OTHER PUBLICATIONS

European Search Report dated Jan. 20, 2009 issued in European Application No. 06126232.5.

* cited by examiner

*Primary Examiner*—Archene Turner
(74) *Attorney, Agent, or Firm*—Drinker Biddle & Reath LLP

(57) ABSTRACT

The present invention relates to a cutting tool insert for metal machining comprising a substrate with a first coating and an outermost PVD-layer. The insert further comprises clearance faces and rake faces intersecting to form cutting edges having essentially no edge radius. The first coating has been removed so that the outermost PVD-layer is the only layer on the clearance face at least close to the cutting edge. The present invention also relates to a method of making such an insert. The inserts according to the present invention gives an increased tool life.

14 Claims, No Drawings

CUTTING TOOL INSERT

BACKGROUND OF THE INVENTION

The present invention relates to a coated cutting tool insert with a sharp cutting edge particularly useful for machining of non ferrous materials such as titanium, aluminium, brass, bronze, heat resistant and super alloys, plastics as well as small part machining in steel and stainless steel.

For the machining of metals, like milling, turning and drilling, cutting tool inserts of cemented carbide having a rake face and clearance faces intersecting to form a cutting edge are used. The cutting edge should be sharp to provide low cutting forces and low energy consumption. However, cemented carbide is a brittle material and for that reason a sharp cutting edge is generally not strong enough. If it breaks, the cutting forces increase and the surface finish of the machined material will be poor. In order to strengthen the edge, it can be rounded to a radius of generally 10-50 µm, or provided with a chamfer or a land. The exact design of the edge depends on the material to be machined and is a compromise between acceptable cutting forces and strength of the edge. Some workpiece materials such as aluminium, etc., require a very sharp edge with minimal edge rounding. An excessively rounded edge can in such materials represent a worn edge and can affect the subsequent wear development. For the machining of such materials, uncoated cemented carbide inserts are generally used. If a coating is applied, the edge will be less sharp particularly if coated with CVD- or MTCVD-techniques. In addition, coated cutting edges require a certain amount of rounding to ensure a satisfactory application of a coating. It is however, a desire to be able to use coated inserts also for the machining of materials requiring sharp cutting edges.

US patent application 2006/0019120 A1 discloses a cutting tool insert for metal machining comprising a coating comprising at least one wear resistant layer and a substrate and said insert further comprising clearance faces and rake faces intersecting to form cutting edges. The cutting edge has essentially no edge radius. The coating has been removed by grinding on the clearance face at least close to the cutting edge. It has, however, been found that such an insert has in some applications insufficient wear resistance.

OBJECTS AND SUMMARY OF THE INVENTION

It is therefore an object of the present invention to provide a method of making coated cemented carbide cutting inserts with a sharp edge and long tool life.

In one aspect of the invention, there is provided a cutting tool insert for metal machining comprising a substrate with a first coating comprising one or more layers and an outermost PVD-layer, said insert further comprising clearance faces and rake faces intersecting to form cutting edges having essentially no edge radius, wherein the first coating has been removed so that the outermost PVD-layer is the only layer on the clearance face at least close to the cutting edge.

In another aspect of the invention, there is provided a method of making a cutting tool insert for metal machining comprising a substrate with a first coating and an outermost PVD-layer, said insert further comprising clearance faces and rake faces intersecting to form cutting edges, comprising the steps of providing a cutting tool insert with a first coating comprising one or more layers, subjecting at least the rake face of said insert to a blasting operation to obtain a smooth surface with a surface roughness ($R_a$) of less than 0.3 µm over a measured length of 0.25 mm and subjecting the insert to a peripheral grinding operation, either around the cutting edge or on the whole clearance side, with a fine grinding wheel to obtain a cutting edge with essentially no edge radius and removing said first coating from the clearance side at least close to the cutting edge, and depositing an outermost wear resistant layer using PVD-technique.

DETAILED DESCRIPTION OF THE PREFERRED EMBODIMENTS

According to the invention, an insert with a sharp edge is provided with a first coating comprising one or several layers and an outermost PVD-layer and a substrate, said insert further comprising clearance faces and rake faces intersecting to form cutting edges having essentially no edge radius. The first coating has been removed so that the outermost PVD-layer is the only layer on the clearance side at least close to the cutting edge.

In one embodiment of the present invention, the first coating, prior to blasting and grinding is an alumina layer, preferably an α-alumina layer, with a thickness of from about 1 to about 10 µm, preferably from about 3 to about 6 µm.

In another embodiment of the present invention, the first coating further comprise an inner layer of Ti(C,N) between the alumina layer and the substrate with a thickness of from about 1 to about 10 µm, preferably from about 4 to about 7 µm, with columnar grains.

The outermost PVD-layer is thus the only layer on the clearance face at least close to the cutting edge. Preferably it is the only layer on the clearance face. The PVD-layer is preferably from about 1 to about 6, preferably from about 2 to about 3 µm and preferably comprise one or more of Ti(C,N), TiN or (Ti,Al)N.

The present invention also relates to a method of making a coated cutting tool insert with an extremely sharp edge by
- providing a cutting tool insert with a first coating comprising one or more layers,
- subjecting at least the rake face of said insert to a blasting operation to obtain a smooth surface with a surface roughness ($R_a$) of less than 0.3 µm over a measured length of 0.25 mm,
- subjecting the insert to a peripheral grinding operation using a fine grinding disk, either around the cutting edge or on the whole clearance side, to obtain a cutting edge with essentially no edge radius and removing the first coating from the clearance side, at least close to the cutting edge,
- depositing a from about 1 to about 6, preferably from about 2 to about 3 µm wear resistant layer using PVD-technique. The wear resistant layer is preferably Ti(C,N), TiN or (Ti,Al)N.

In one embodiment of the present invention the first coating is an alumina layer, preferably an α-alumina layer, with a thickness of from about 1 to about 10 µm, preferably from about 3 to about 6 µm.

In another embodiment of the method of the present invention, the first coating further comprises an inner layer of Ti(C,N) between the alumina layer and the substrate with a thickness of from about 1 to about 10 µm, preferably from about 4 to about 7 µm, with columnar grains.

The inserts according to the present invention can be used in various cutting operations. Examples of such cutting operations are drilling, turning and milling.

The invention is additionally illustrated in connection with the following examples, which are to be considered as illustrative of the present invention. It should be understood, however, that the invention is not limited to the specific details of the examples.

Example 1

Cemented carbide inserts of style VCEX 110301 R-F with a composition of 6% Co and as balance WC were coated with a 0.5 μm equiaxed TiCN-layer followed by a 5 μm thick TiCN layer with columnar grains by using MTCVD-technique (process temperature 850° C.). In subsequent process steps during the same coating cycle, a 1 μm thick layer with equiaxed grains of $TiC_xN_yO_z$ (approx. x=0.6, y=0.2 and z=0.2) was deposited followed by a 4 μm thick layer of $\alpha$-$Al_2O_3$ deposited. After coating the inserts were smoothed by wet blasting to a surface roughness of 0.2 μm over a measured length of 0.25 mm. Then the inserts were subjected to a peripheral grinding operation by a diamond disk with 25 μm grain size to obtain a sharp cutting edge by removing the coating on the flank face.

Example 2

Invention

Half of the inserts from Example 1 were coated with a 2-3 μm layer of (Ti,Al)N using PVD-technique.

Example 3

Inserts from examples 1, prior art, and 2, invention, were tested under the following conditions:

Longitudinal Turning of Stainless Steel SS2346
Cutting speed: 150 m/min
Feed: 0.1 mm/rev
Cutting depth: 1 mm
Oil Coolant As a further reference Sandvik Coromant commercial grade GC1020 was used. Tool life criterion was flank wear>0.08 mm or excessive crater wear.

Results, average of three tests:

|           | Time in cut, min | Note                  |
|-----------|------------------|-----------------------|
| Invention | 288              | Flank wear > 0.08 mm  |
| Prior art | 147              | Flank wear > 0.08 mm  |
| Reference | 183              | Excessive crater wear |

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. Cutting tool insert for metal machining comprising a substrate with a first coating comprising one or more alumina layers and an outermost PVD-layer, said insert further comprising clearance faces and rake faces intersecting to form cutting edges having essentially no edge radius, wherein the one or more alumina layers has been removed so that the outermost PVD-layer is the only layer on the clearance face at least close to the cutting edge.

2. A cutting tool insert of claim 1 wherein the outermost PVD-layer is the only layer on the clearance face.

3. A cutting tool insert of claim 1 wherein a phase of alumina in the one or more alumina layers is $\alpha$-alumina.

4. A cutting tool insert of claim 1 wherein said first coating includes an inner layer of Ti(C,N) between the one or more alumina layers and the substrate with a thickness of from about 2 to about 10 μm, with columnar grains.

5. A cutting tool insert of claim 1 wherein the outermost PVD layer is Ti(C,N), TiN or (Ti,Al)N.

6. A cutting tool insert of claim 5 wherein the outermost PVD layer is (Ti,Al)N.

7. A cutting tool insert of claim 5 wherein said one or more alumina layers has a thickness of from about 4 to about 7 μm.

8. A cutting tool insert of claim 5 wherein said outermost PVD layer has a thickness of from about 1 to about 6 μm.

9. A cutting tool insert of claim 8 wherein said outermost PVD layer has a thickness of from about 2 to about 3 μm.

10. A cutting tool insert of claim 1 wherein said one or more alumina layers has a thickness of from about 1 to about 10 μm.

11. A cutting tool insert of claim 10 wherein said one or more alumina layers has a thickness of from about 3 to about 6 μm.

12. Method of making a cutting tool insert for metal machining comprising a substrate with a first coating and an outermost PVD-layer, said insert further comprising clearance faces and rake faces intersecting to form cutting edges, comprising the steps of:
    providing a cutting tool insert with a first coating comprising one or more alumina layers,
    subjecting at least the rake face of said insert to a blasting operation to obtain a smooth surface with a surface roughness ($R_a$) of less than 0.3 μm over a measured length of 0.25 mm and
    subjecting the insert to a peripheral grinding operation, either around the cutting edge or on the whole clearance side, with a fine grinding wheel to obtain a cutting edge with essentially no edge radius and removing said first coating from the clearance side at least close to the cutting edge, and
    depositing on at least a portion of the clearance side from which the first coating has been removed an outermost wear resistant layer using PVD-technique.

13. The method of claim 12 wherein the outermost PVD layer is Ti(C,N), TiN or (Ti,Al)N.

14. The method of claim 12 wherein the outermost PVD layer is (Ti,Al)N.

* * * * *